(12) United States Patent
Yu et al.

(10) Patent No.: US 11,335,739 B2
(45) Date of Patent: May 17, 2022

(54) DISPLAY PANEL AND DISPLAY DEVICE

(71) Applicant: Xiamen Tianma Micro-Electronics Co., Ltd., Xiamen (CN)

(72) Inventors: Quanpeng Yu, Shanghai (CN); Zhe Li, Shanghai (CN); Jujian Fu, Shanghai (CN); Tianyi Wu, Shanghai (CN); Xilie Li, Xiamen (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 245 days.

(21) Appl. No.: 16/681,755

(22) Filed: Nov. 12, 2019

(65) Prior Publication Data

US 2020/0201392 A1    Jun. 25, 2020

(30) Foreign Application Priority Data

Dec. 20, 2018    (CN) .......................... 201811562218.0

(51) Int. Cl.
*G06F 1/16*    (2006.01)
*H01L 27/32*    (2006.01)
(Continued)

(52) U.S. Cl.
CPC .......... *H01L 27/323* (2013.01); *G06F 1/1652* (2013.01); *G06F 3/0412* (2013.01);
(Continued)

(58) Field of Classification Search
CPC . H01L 27/3276; H01L 27/323; H01L 27/322; H01L 51/0097; H01L 2251/5338;
(Continued)

(56) References Cited

U.S. PATENT DOCUMENTS

2005/0001211 A1* 1/2005 Yamazaki ........... H01L 21/2007
                                                    257/52
2014/0184951 A1* 7/2014 Yeh ....................... G06F 3/0412
                                                    349/12
(Continued)

FOREIGN PATENT DOCUMENTS

CN    103927043 A    7/2014
CN    105161514 A    12/2015
(Continued)

OTHER PUBLICATIONS

CN Office Action, dated Sep. 2, 2020.

*Primary Examiner* — Christopher E Leiby
(74) *Attorney, Agent, or Firm* — Alston & Bird LLP

(57) ABSTRACT

The present disclosure provides a display panel and a display device, comprising: a flexible base substrate comprising a first flexible substrate, a second flexible substrate, and metal signal lines located between the first flexible substrate and the second flexible substrate; a display unit disposed on the flexible base substrate; a touch unit disposed on a light-exiting side of the display unit and covering the display unit; and a processing chip connected to the flexible base substrate for receiving and feeding back signals from the display unit and/or the touch unit. The metal signal lines are electrically connected to the processing chip and the touch unit transmits a touch signal to the metal signal lines through a conductive adhesive. By transmitting the touch signal to the processing chip through the conductive adhesive, the touch unit and the display unit can share one processing chip.

12 Claims, 7 Drawing Sheets

(51) Int. Cl.
*G06F 3/041* (2006.01)
*G09G 3/3266* (2016.01)
*G09G 3/3275* (2016.01)
*H01L 51/00* (2006.01)

(52) U.S. Cl.
CPC ....... *G06F 3/04164* (2019.05); *G09G 3/3266* (2013.01); *G09G 3/3275* (2013.01); *H01L 27/322* (2013.01); *H01L 51/0097* (2013.01); *G09G 2380/02* (2013.01)

(58) Field of Classification Search
CPC .. G06F 3/0446; G06F 3/0412; G06F 3/04164; G06F 1/1652; G06F 2203/04102; G09G 3/3275; G09G 3/3266; G09G 2380/02; Y02E 10/549
See application file for complete search history.

(56) References Cited

U.S. PATENT DOCUMENTS

| | | | | |
|---|---|---|---|---|
| 2018/0145124 | A1* | 5/2018 | Kim | H01L 27/3248 |
| 2019/0373719 | A1* | 12/2019 | Lee | H05K 1/0271 |
| 2019/0393277 | A1* | 12/2019 | An | H01L 23/544 |
| 2020/0127220 | A1* | 4/2020 | Kim | H01L 51/5012 |
| 2020/0341576 | A1* | 10/2020 | Kahng | G06F 3/047 |
| 2021/0149511 | A1* | 5/2021 | Chung | G02F 1/136222 |

FOREIGN PATENT DOCUMENTS

| | | |
|---|---|---|
| CN | 105489634 A | 4/2016 |
| CN | 206134682 U | 4/2017 |
| CN | 107203296 A | 9/2017 |
| CN | 107340928 A | 11/2017 |
| CN | 108831306 A | 11/2018 |
| CN | 108922911 A | 11/2018 |

* cited by examiner

100

100

DISPLAY PANEL AND DISPLAY DEVICE

CROSS-REFERENCE TO RELATED APPLICATIONS

The present disclosure claims priority to Chinese Patent Application No. CN201811562218.0, filed at CNIPA on Dec. 20, 2018, the content of which is incorporated herein by reference in its entirety.

TECHNICAL FIELD

The present disclosure relates to the field of display technologies, and in particular, to a display panel and a display device.

BACKGROUND

Currently, display technology has entered into various aspects of people's daily life, and accordingly, ever more materials and technologies have been applied in making display screens. Today, mainstream display screens mainly include liquid crystal display screens and organic light-emitting diode display screens. Among them, the organic light-emitting diode (OLED) display screens omits the most energy-consuming backlight module as in the liquid crystal display screens, because of their self-luminous performance, is thus more energy-conserving. In addition, the OLED display screen has the characteristics of being flexible and bendable. By adopting a flexible substrate, multiple conductive layers in the display panel can be sequentially formed on the flexible substrate, including a thin film transistor driving array layer, an anode layer, an organic light-emitting layer, a cathode layer, and a thin film encapsulation layer, such that the OLED display screen has excellent bendability.

In addition, the current electronic devices related to OLED display screens need to integrate touch functions. The touch function layer on the existing OLED display screen is separate from the OLED display screen. One problem is that the OLED display screen and the touch function layer are disposed on two different flexible print circuits (FPC). Each of the two flexible print circuits is provided with a display control chip and a touch control chip, respectively. The two FPCs introduce certain drawbacks in cost and thickness of the display sheet.

SUMMARY

The present disclosure provides a display panel and a display device.

In one aspect, embodiments of the present disclosure provide a display panel, including: a flexible base substrate including a first flexible substrate, a second flexible substrate, and a plurality of metal signal lines located between the first flexible substrate and the second flexible substrate; a display unit disposed on the flexible base substrate; a touch unit disposed on a light-exiting side of the display unit and covering the display unit; and a processing chip connected to the flexible base substrate and configured to receive and feedback signals from the display unit and/or the touch unit; the plurality of metal signal lines is electrically connected to the processing chip; and the touch unit transmits a touch signal to the plurality of metal signal lines through a conductive adhesive.

In another aspect, embodiments of the present disclosure provide a display device including a display panel, the display panel includes: a flexible base substrate including a first flexible substrate, a second flexible substrate, and a plurality of metal signal lines located between the first flexible substrate and the second flexible substrate; a display unit disposed on the flexible base substrate; a touch unit disposed on a light-exiting side of the display unit and covering the display unit; and a processing chip connected to the flexible base substrate and configured to receive and feedback signals from the display unit and/or the touch unit; the plurality of metal signal lines is electrically connected to the processing chip; and the touch unit transmits a touch signal to the plurality of metal signal lines through a conductive adhesive.

BRIEF DESCRIPTION OF DRAWINGS

In order to more clearly illustrate the technical solutions of embodiments of the present disclosure, the accompanying drawings used in the embodiments are briefly described below. It should be noted the drawings described below are merely a part of the embodiments of the present disclosure. Based on these drawings, those skilled in the art can obtain other drawings without any creative effort.

DESCRIPTION OF EMBODIMENTS

Figure 1:
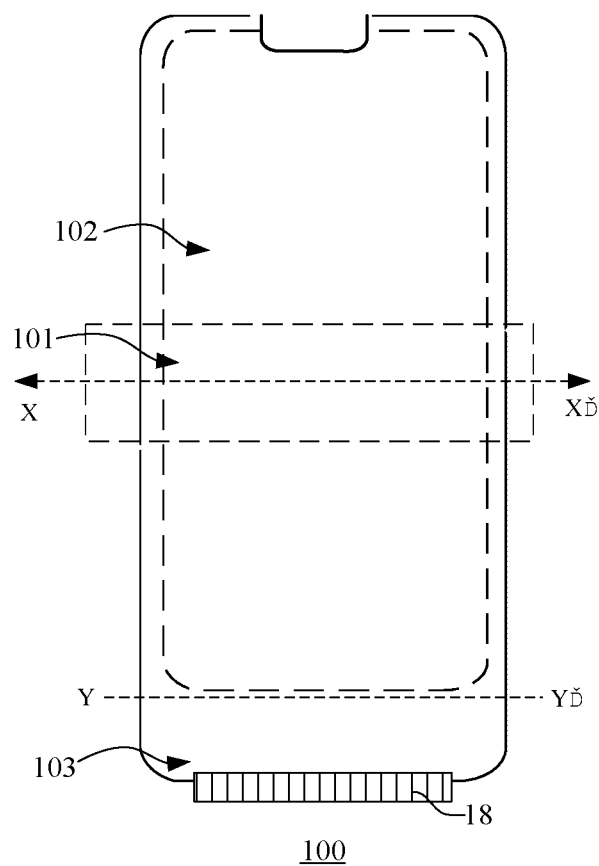
FIG. 1 illustrates a structural schematic diagram of a display panel 100 according to an embodiment of the present disclosure.

For a better understanding of the technical solutions of the present disclosure, the embodiments of the present disclosure are described in detail below with reference to the accompanying drawings.

It should be noted that the described embodiments are merely some embodiments of the present disclosure, but not all of the embodiments. All other embodiments obtained by those skilled in the art based on the embodiments of the present disclosure without creative efforts are within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein merely indicates an association relationship to describe the associated objects, meaning that there may be three relationships, for example, A and/or B may indicate three cases: only A exists; both A and B exist; and only B exists. In addition, the character "/" as used herein generally indicates that the contextual associated objects are in an "or" relationship.

It is to be understood that the terms "substantially", "approximate", "roughly", "about", "basically", "generally", and the like as used in the claims and embodiments of the present disclosure indicate an object that can be generally accepted within a reasonable process operation or within the tolerance range, rather than an exact value.

It should be understood that although the terms first, second, third, etc. may be used to describe flexible substrates in embodiments of the present disclosure, these flexible substrates are not limited to these terms. These terms are only used to distinguish the flexible substrates from one another. For example, the first flexible substrate may also be referred to as a second flexible substrate, and similarly, the second flexible substrate may also be referred to as a first flexible substrate without departing from the scope of the embodiments of the present disclosure.

This application has proposed new structures in order to reduce the number of FPCs in the OLED display panel. The new structures implement an object to direct the signal of the touch unit located on the light-exiting side of the display unit to the processing chip, the processing chip is located at one end of the flexible base substrate, away from the touch unit. The touch signal of a touch unit located on a light-exiting side of a display unit is electrically connected to the processing chip through a conductive adhesive, such that control function of the touch unit and the display unit may share the same processing chip. Therefore, flexible print circuits and touch chips only for touch units are eliminated.

The display panel includes: a flexible base substrate which includes a first flexible substrate, a second flexible substrate, and a plurality of metal signal lines disposed between the first flexible substrate and the second flexible substrate; a display unit disposed on the flexible base substrate; a touch unit disposed on a light-exiting side of the display unit and covering the display unit; and a processing chip connected to the flexible base substrate and configured to receive and feedback signals from one or more of the display unit and the touch unit. The metal signal lines are electrically connected to the processing chip and the touch unit transmits a touch signal to the metal signal lines through a conductive adhesive.

Figure 2:
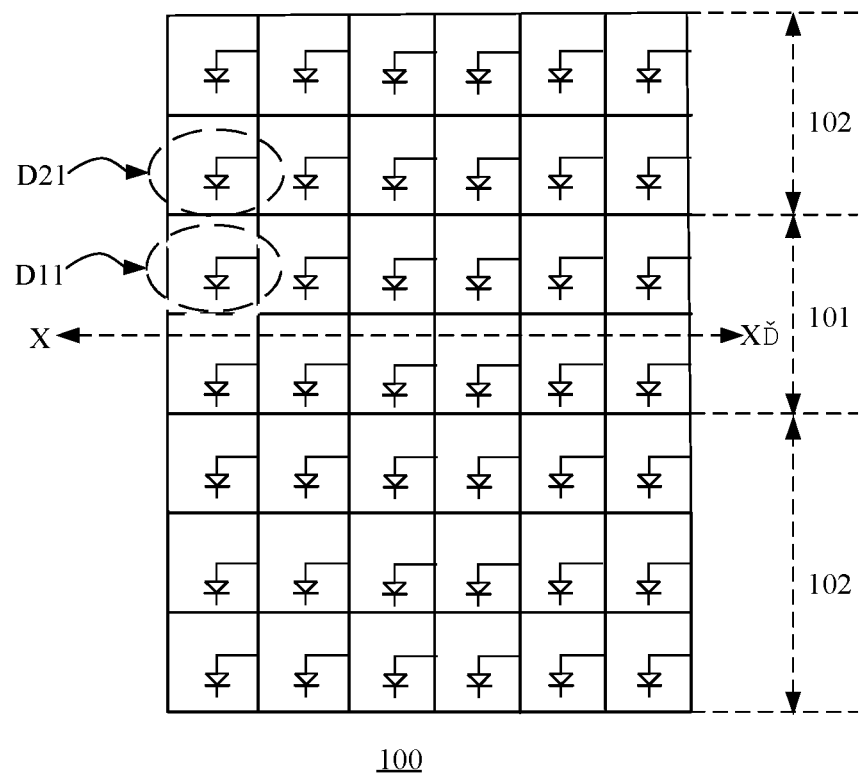
FIG. 2 illustrates still another schematic diagram of the display panel 100 of FIG. 1.
Figure 3:
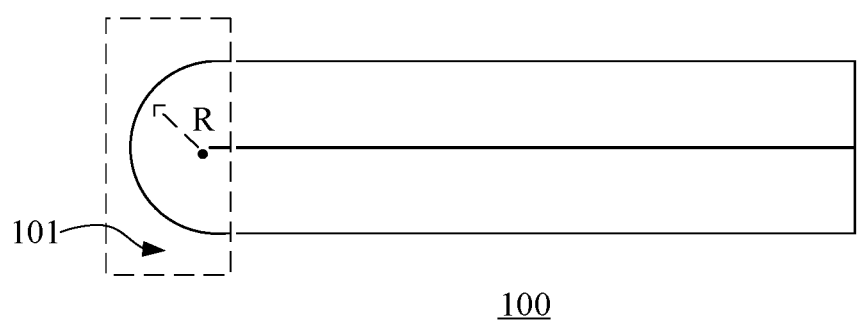
FIG. 3 illustrates a schematic diagram of the display panel 100 of FIG. 1 in a bending state.

FIGS. 1-9, embodiments of the present disclosure provides a display panel 100, and the display panel can be a flexible bendable display panel. As shown in FIGS. 1-4, the display panel 100 includes a non-bending area 102 and a bending area 101. The bending area 101 of the display panel can be bent at different angles along a first virtual bending axis XX'. As shown in FIG. 3, the display panel 100 can be completely symmetrically folded along a first virtual bending axis XX', such that the size of the display panel is reduced to half the size in the unfolding state. It should be noted that the first virtual bending axis XX' is not a physically existing component, but a virtual line segment along which the display panel 100 is folded. Alternatively, a region in the bending area 101, which is actually a preset display area on the display panel, is arbitrarily referred to as a first virtual bending axis XX'. In addition, the first virtual bending axis XX' may be located at the centerline position of the bending area 101, and the flexible display panel 100 or the flexible display module may be symmetrically bent or folded along the first virtual bending axis XX'.

Figure 4:
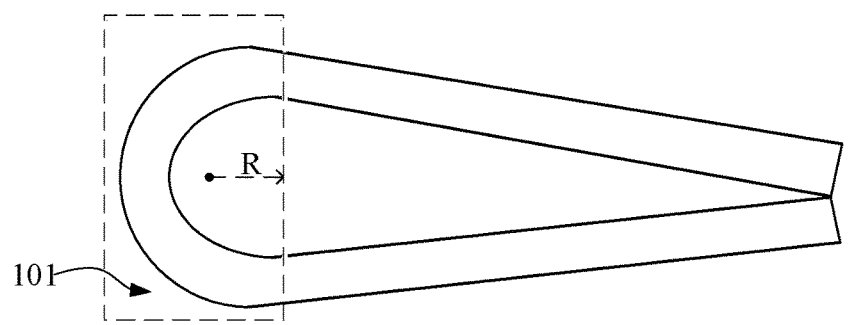
FIG. 4 illustrates a schematic diagram of the display panel 100 of FIG. 1 in another bending state.

In another embodiment, as shown in FIG. 4, the display panel 100 may be folded along a bending axis according to a folding mechanism (not shown in FIG. 4), and the bending area 101 in a folding state presents as an arc structure. Of course, in the embodiments of the present disclosure, the flexible display panel 100 can be folded towards an image displayed on the screen, which is simply referred to as "infolding", or be folded away from the image displayed on the screen, which is simply referred to as "exfolding". In addition, as shown in FIG. 2, the display area of the display panel 100 includes the bending area 101 and the non-bending area 102, and the bending area 101 of the display area includes a plurality of first pixels D11; the non-bending area 102 of the display area includes a plurality of second pixels D21. That is, the bending area 101 of the display area can display images normally as other areas of the display area, such as the non-bending area 102.

The reason why the display panel in the embodiments of the present disclosure can be folded or bent lies in that the display panel 100 has the flexible base substrate, such as a polymer material substrate with a high light transmittance, such that the display panel can realize the flexibly bendable state. In the embodiments of the present disclosure, the bending radius R of curvature of the display panel is between 0.3 mm and 1.0 mm, such that the user can freely implement the bending operation. The term "bending" used herein includes bending operations in different angular directions, including a symmetrical folding. FIGS. 3-4 only provide two different bending states as an example.

Further, with continued reference to FIG. 1, the display panel 100 further includes a lower step area 103 (also a non-display area), in which various types of metal routing lines, various interfaces, and circuit structures connected to the display area are provided, such as a VT test port, an ESD protection structure, a power signal line, and the like. The more important thing is that, a processing chip 18 is bound to this area by a COP (Chip On PI or Chip On Plastic, i.e., chip is integrated in a polymer substrate) process, such that controls on the display function and the touch function of the display panel 100 are realized. The processing chip 18 is located at an end of the lower step area 103 far away from the display area, and is connected to a corresponding flexible print circuit FPC (not shown in the drawing) through a pad thereon.

Figure 5:
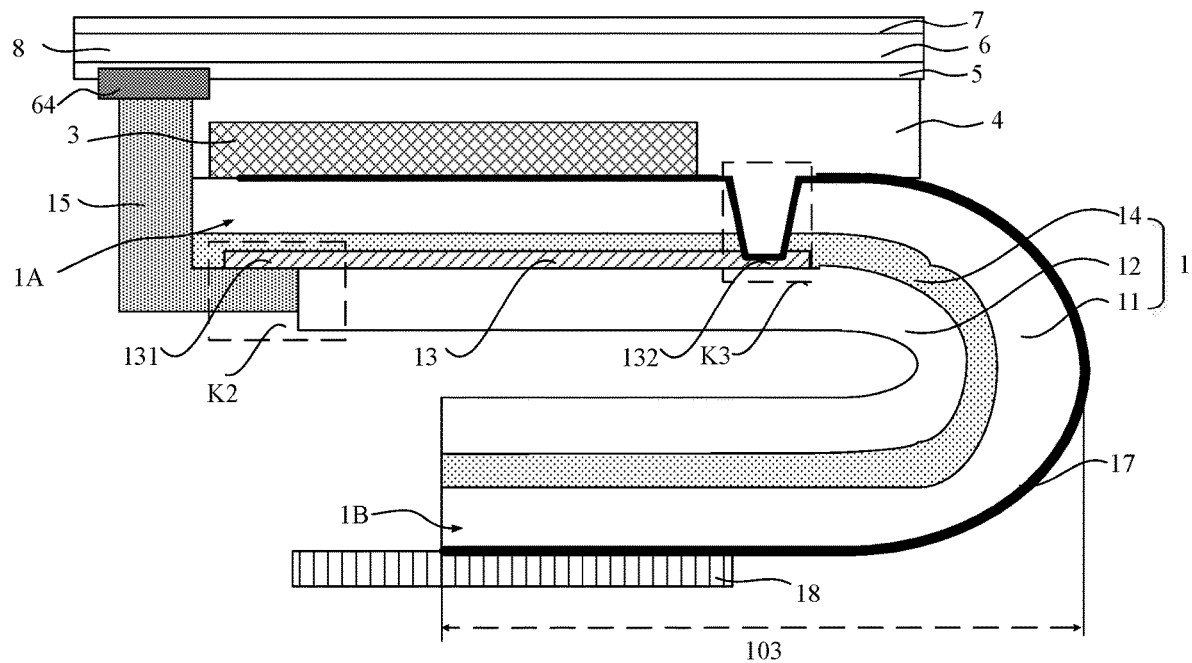
FIG. 5 illustrates still another schematic diagram of the display panel 100 of FIG. 1.

In addition, since the display panel adopts the flexible base substrate, the lower step area 103 can be bent along the dashed line YY' in FIG. 1 until the lower step area 103 is bent to the back surface of the display panel 100. As shown in FIG. 5, when the display panel 100 is assembled into a display module or a display device, the lower step area 103 of the display product can be reduced by bending the lower step area 103 of the display panel 100, thereby reducing the occupancy ratio of the non-display area and increasing the screen occupancy ratio.

With continued reference to FIGS. 5-8, the display panel 100 includes a flexible base substrate 1 and a cover substrate 5 disposed oppositely to the flexible base substrate 1, and the two are connected by a transparent optical adhesive 4 in a full-fitting manner. The full-fitting manner means that the optical adhesive 4 is coated on the entire flexible base substrate 1 except the lower step area 103, thereby achieving complete fitting between the flexible base substrate 1 and the cover substrate 5.

As shown in FIG. 5, the display panel 100 further includes a display unit 3, a touch unit 6, and a protection structure 7. The display unit 3 is formed on the flexible base substrate 1. The display unit 3 is located in the display area and includes a plurality of first pixels D11 and a plurality of second pixels D21 (shown in FIG. 2). The display unit 3 includes a plurality of pixel driving circuits and a plurality of organic light-emitting devices, forming the first pixels D11 and the second pixels D21; and the display unit 3 also includes a plurality of metal traces with different functions, such as a scan driving signal line, a data signal line, a light-emitting control signal line, a constant level trace, and the like. In addition, in the present disclosure, the organic light-emitting devices in the display panel are of the top emission type, that is, the light extraction direction of the display unit 3 is directed from the flexible base substrate 1 to the cover substrate 5, and light transmits through the cover substrate 5 to the outside.

Figure 6:
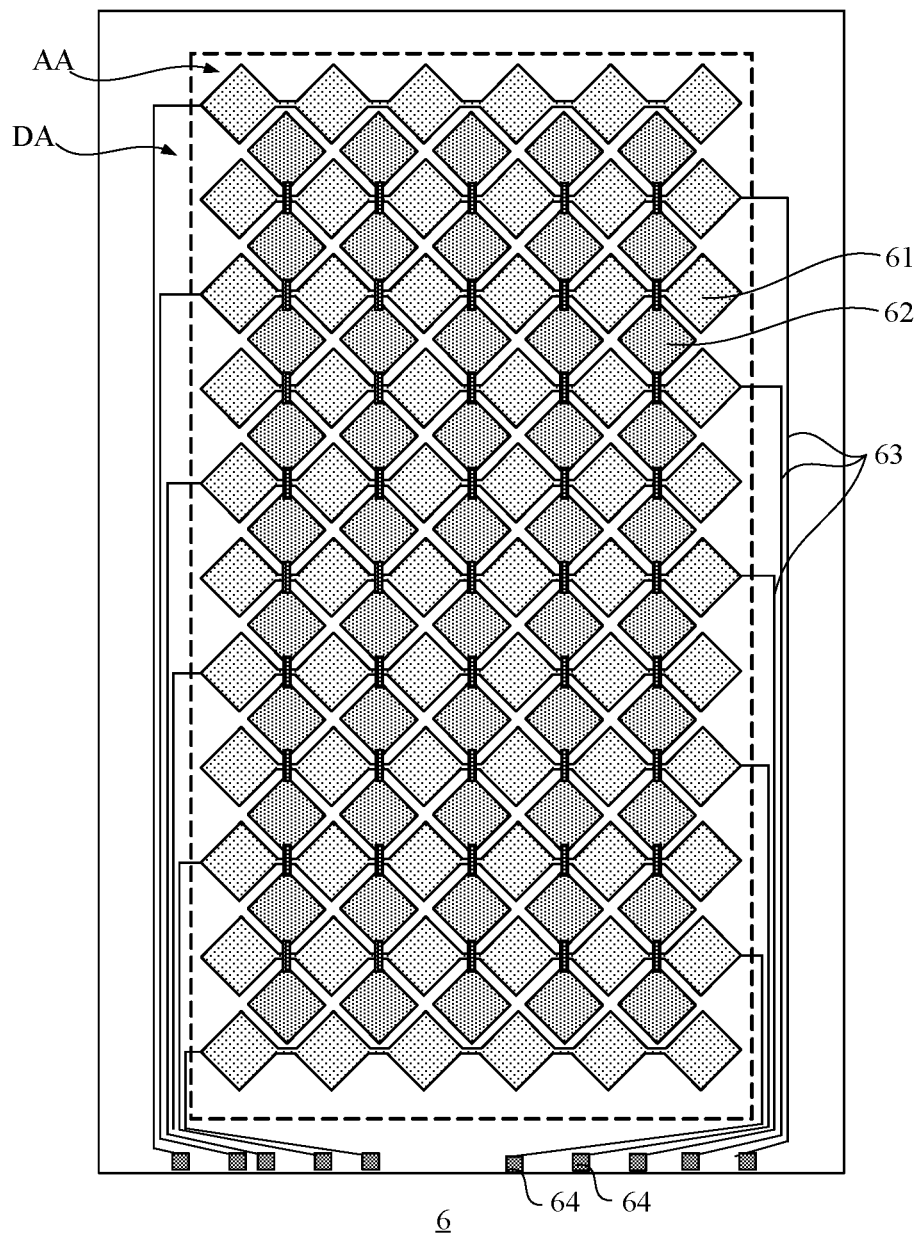
FIG. 6 illustrates a structural schematic diagram of a touch unit 6 of FIG. 5.

The touch unit 6 is formed on the cover substrate 5, located on a light-exiting side of the display unit 3 and covers the display unit 3. The touch unit 6 covers at least the display area of the display panel. The touch unit 6 is a light transmittance structure. As shown in FIG. 6, the touch unit 6 may include a plurality of touch electrodes located in the display area AA of the display panel and a plurality of first touch lead lines 63 connected to the plurality of touch electrodes. The first touch lead lines 63 may be located in the non-display areas DA at two sides of the display panel. The first touch leads lines 63 connect the touch unit 6 and the corresponding processing chip 18, such that the processing chip 18 can receive a control signal and feed it back to the touch unit 6. In some embodiments of the present disclosure, the plurality of touch electrodes includes touch sensing electrodes 61 and touch feedback electrodes 62 that are independent from the touch sensing electrodes 61, and whether a touch action occurs or not is sensed based on a change in capacitance between the touch sensing electrode 61 and the touch feedback electrode 62. It can be understood that the touch unit 6 adopts a mutual capacitance touch mode. In addition, each pair of the touch sensing electrode and the touch feedback electrode is electrically connected to at least one first touch lead line 63, such that the touch signals on the touch electrodes are transmitted to the processing chip 18. It should be noted that, since the touch unit 6 is a light transmittance structure, the touch electrodes may be made of a transparent conductive material, such as indium tin oxide ITO, or be formed by a mesh metal pattern. In addition, in the embodiments of the present disclosure, each touch electrode correspondingly covers multiple first pixels D11 or second pixels D21, and each touch electrode has an electrode pattern that can cover at least 20 pixels. If the electrode pattern is formed by using a mesh metal pattern, it is necessary to cover the first pixels D11 or the second pixels D21 in the hollow portions of the mesh metal pattern, such that the light emitted by the pixels is not blocked by the touch electrode.

Figure 7:
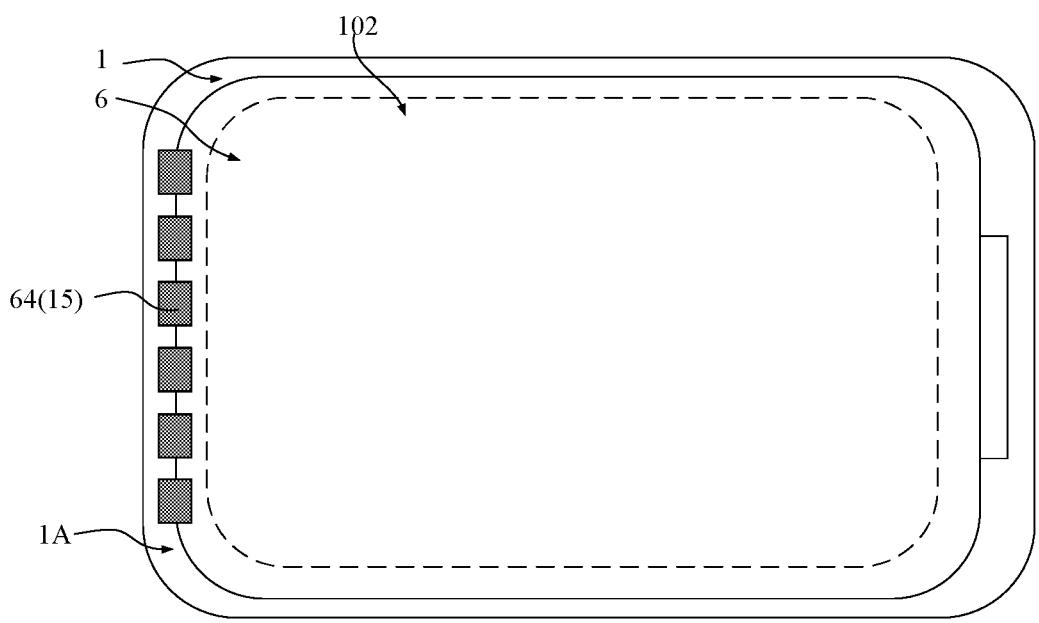
FIG. 7 illustrates a top plan diagram of the display panel 100 of FIG. 1.
Figure 8:
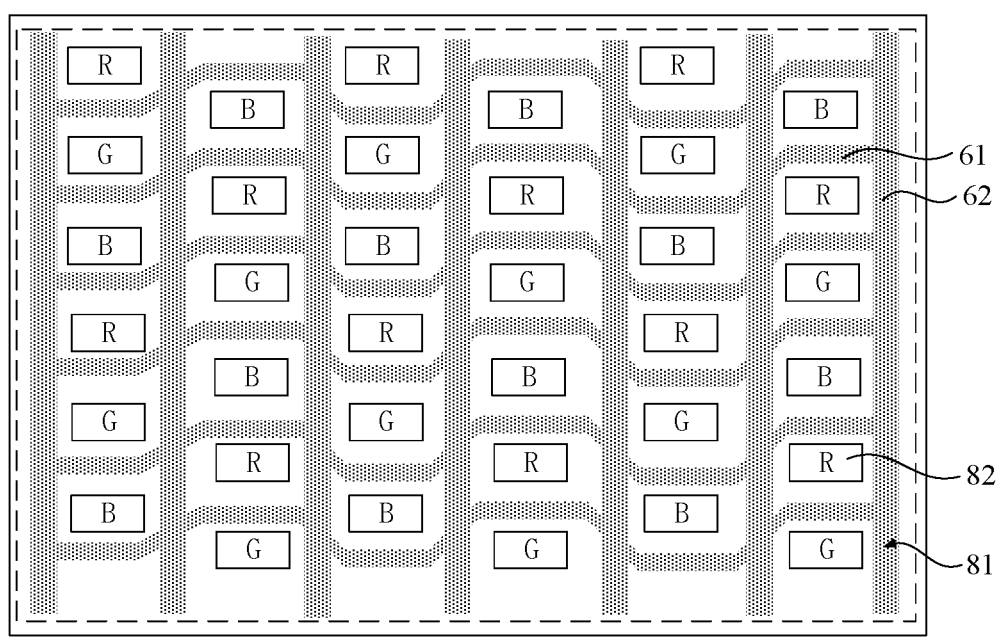
FIG. 8 illustrates a structural schematic diagram of a color filter unit 8 of FIG. 5.

With continued reference to FIGS. 5-7, in an area of the touch unit 6 corresponding to a first end 1A of the flexible base substrate 1, the end of each of the first touch lead lines 63 has one touch signal pad 64, and these touch signal pads 64 are arranged in a direction parallel to a width direction of the touch unit 6. The control signal applied by the processing chip 18 to the touch unit 6 is transmitted to the first touch lead line 63 through the corresponding touch signal pad 64.

With continued reference to FIGS. 5-7, the flexible base substrate 1 includes a first flexible substrate 11, a second flexible substrate 12, and an inorganic insulating layer 14 disposed between the first flexible substrate 11 and the second flexible substrate 12, for enhancing the mechanical strength of the flexible base substrate 1. In the present disclosure, both the first flexible substrate 11 and the second flexible substrate 12 are made of a high light transmittance polymer material such as a PI polymer material or a PET polymer material. Although the organic polymer materials have good bending properties, their mechanical strength is weak and the barrier property against moisture and/or oxygen is poor. In view of this, by adding the inorganic insulating layer 14 between the first flexible substrate 11 and the second flexible substrate 12, the inorganic insulating layer 14 being made of silicon nitride, silicon oxide, silicon oxynitride or a combination thereof, the overall mechanical properties and the water/oxygen barrier ability of the flexible base substrate 1 are increased. However, since the inorganic insulating layer 14 is a dense oxide structure, the thickness thereof needs to be controlled to be less than or equal to one eighth of the thickness of the first flexible substrate 11 and/or the second flexible substrate 12. If the thickness of the inorganic insulating layer 14 is too large, when the display panel 100 is bent, stress that cannot be absorbed by the first flexible substrate 11 and/or the second flexible substrate 12 will be generated, which will adversely affect the bending performance of the display panel 100.

With continued reference to the above figures, the flexible base substrate 1 further includes a plurality of metal signal lines 13 located between the first flexible substrate 11 and the second flexible substrate 12. The plurality of metal signal line 13 is electrically connected to the processing chip 18. The signal on each of the first touch lead lines 63 is transmitted to the corresponding metal signal line 13 through a conductive adhesive 15, and then transmitted to the processing chip 18, so that the touch signals on the touch electrodes are transmitted and fed back to the processing chip 18. It should be noted that the conductive adhesive 15 of the present disclosure has a good electrical conductivity, and its electrical conductivity is not less than the electrical conductivity of the metal copper. In some embodiments, the conductive adhesive 15 includes a mixed conductive adhesive of a UV (ultraviolet) curable adhesive and Ag particles. By irradiating the conductive adhesive 15 with ultraviolet light, each touch signal pad 64 and the end of the corresponding metal signal line 13 can be bonded together, so that the first touch lead line 63 and the corresponding metal signal line 13 are electrically connected.

As shown in FIG. 5, in some embodiments of the present disclosure, the display panel 100 further includes a plurality of first metal lead lines 17 located in the non-display area, specifically in the lower step area 103. The first metal lead lines 17 are formed by patterning a first metal layer. In order to save the corresponding process steps, the first metal lead lines 17 can be formed in the same layer as the corresponding metal traces in the display area. For example, one or more of a data line, a scan line, a light-emitting signal control line, and a capacitor electrode plate in the display area of the display panel 100 are formed by patterning the first metal layer. Therefore, the touch signal is conducted to the metal signal line 13 through the conductive adhesive 15, then conducted to the first metal lead line 17 via the metal signal line 13, and then conducted to the processing chip 18 via the first metal lead line 17.

As shown in FIG. 5, the second flexible substrate 12 is located on a side of the first flexible substrate 11 facing away from the display unit 3 and has a second opening K2 (framed in a rectangular dashed line in FIG. 5) at the first end 1A of the flexible base substrate 1. The second opening K2 exposes the first ends 131 of the metal signal lines 13. The conductive adhesive 15 is filled in the second opening K2 for electrically connecting the metal signal line 13 and the corresponding first touch signal line 63. Specifically, the conductive adhesive 15 filled in the second opening K2 bonds the touch signal pad 64 on each of the first touch signal lines 63 to the first end 131 of the corresponding metal signal line 13, thereby realizing electrical connection there between. Further, in the non-display area close to the lower step area 103, the second end 132 of the metal signal line 13 is electrically connected to the first metal lead line 17. As shown in FIG. 5, one end of the first metal lead line 17 is deposited into a third via hole K3 (framed in a rectangular dashed line in FIG. 5) and is in direct contact with the second end 132 of the metal signal line 13, thereby realizing electrical connection there between. In addition, at the second end 1B of the flexible base substrate 1, the other end of the first metal lead line 17 is electrically connected to a pad (not shown in the drawing) on the processing chip 18, for transmitting the signal on the first touch signal line 63 to the processing chip 18.

With continued reference to FIGS. 5-7, a plurality of conductive adhesives 15 are provided, and the plurality of conductive adhesives 15 is arranged in parallel at the first end 1A of the flexible base substrate 1. These conductive adhesives 15 are independent and electrically insulated from one other, and the number of the conductive adhesives 15 is equal to the number of the first touch signal lines 63. As shown in FIG. 5, in an area where each of the conductive adhesives 15 is located, the conductive adhesive 15 covers the end surface of the flexible base substrate 1. That is, the conductive adhesive 15 covers the end surfaces of the first flexible substrate 11, the inorganic insulating layer 14, the metal signal line 13, and the second flexible substrate 12. The bonding and contact surface of the conductive adhesive 15 is large and has a certain uneven surface, which ensures bonding stability and also prevents detachment of the conductive adhesive 15, thereby improving the stability of the touch function of the display panel.

With continued reference to FIG. 5, the flexible base substrate 1 is bent near the second end 1B of the flexible base substrate 1 so that the lower step area 103 is bent to the back surface of the display panel 100 and the processing chip 18 is also bent to a side of the display panel 100 facing away from the light-exiting side. When the flexible base substrate 1 is in a bending state, the processing chip 18 and the flexible base substrate 1 are stacked on each other, such that no lower step area or an extremely narrow lower step area of the display panel will be observed visually to the user.

In the above embodiments, the touch signal on the touch unit 6 is transmitted from the first touch signal line 63 to the metal signal line 13 through the conductive adhesive 15, and then transmitted from the metal signal line 13 to the first metal lead line 17, and then transmitted from the first metal lead line 17 to the processing chip 18. Therefore, signals from the touch unit 6 and the display unit 3 can be double received and fed back via one processing chip 18. In an embodiment, the processing chip 18 can process and feedback signals respectively from the touch unit 6 and the display unit 3 in a time division manner, such that the computational power requirement for the processing chip 18 can be reduced. In the embodiments of the present disclosure, control on the touch unit and the display unit on the display panel can be realized by one processing chip 18, and therefore the processing chip 18 can be correspondingly connected to one flexible print circuit FPC. Thereby, usage of two FPCs and two processing chips in the related art becomes unnecessary.

Based on the above embodiments, with continued reference to FIGS. 5-8, some embodiments of the present disclosure further disclose another display panel 100. The same technical features of this display panel as those in the above-mentioned embodiments will not be described again. The technical points of this display panel 100 will be described below.

The display panel 100 is an organic light-emitting display panel, and further includes a color filter unit 8 which is provided on the light-exiting side of the display unit 3 and covers the display area of the display unit 3 for filtering color for the display unit. The color filter unit 8 may include blocking structures 81 arranged in a matrix and color resists located in the blocking structures 81, such as green color resists G, red color resists R, and blue color resists B. In some embodiments, the pixels in the display panel may be organic light-emitting devices which emit white light and then output light of different wavelength bands through the color filter unit 8, such as red light, green light, blue light, and the like.

With continued reference to FIGS. 5-8, in some embodiments, the touch unit 6 may share the same layer as the color filter unit 8. The blocking structures 81 are made of a conductive material (such as ITO or a mesh metal) and reused as the touch electrodes, that is, the blocking structures 81 form the touch electrodes. The microstructure of the blocking structures 81 may be the touch electrodes as shown in FIG. 6. Therefore, it is unnecessary to adopt an individual conductive layer specifically to form the touch electrodes, thus the process cost is reduced, and the overall thickness of the display panel is also reduced.

Figure 9:
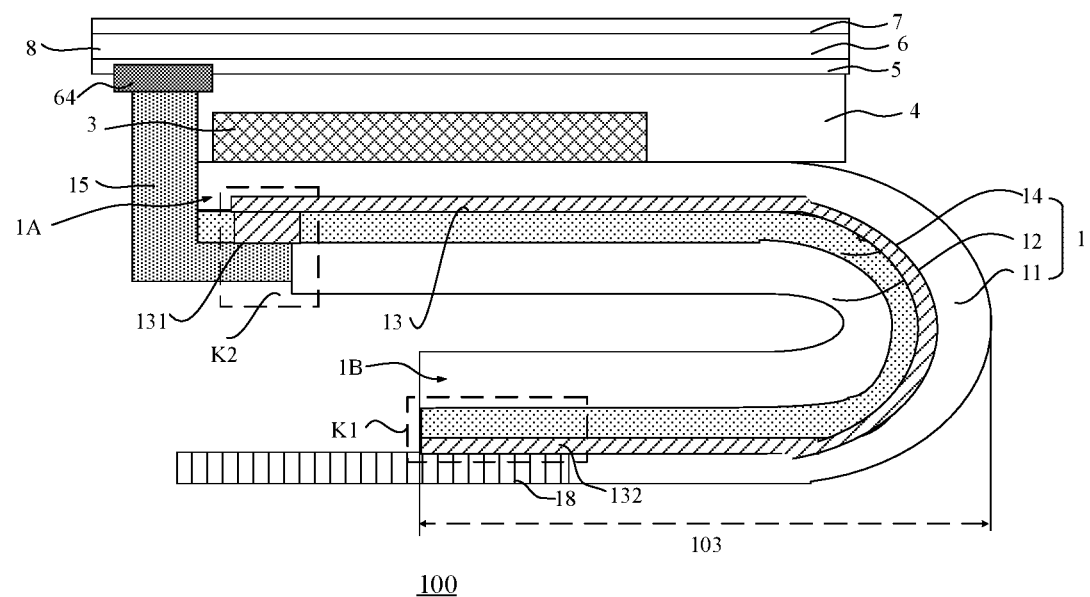
FIG. 9 illustrates a structural schematic diagram of another display panel 100 according to an embodiment of the present disclosure.

Based on the above embodiments, with continued reference to FIG. 9, some embodiments of the present disclosure disclose still another display panel 100. Technical features that are the same as in the above-mentioned embodiments will not be described again. The different technical points of this display panel 100 will be described below.

The display panel 100 includes a plurality of metal signal lines 13, and these metal signal lines 13 cover the inorganic insulating layer 14 and are disposed between the first flexible substrate 11 and the inorganic insulating layer 14. The touch signal on the first touch signal line 63 is transmitted to the metal signal line 13 through the conductive adhesive 15, and then transmitted to the processing chip 18 through the metal signal line 13.

As shown in FIG. 9, on the side facing away from the display unit 3, at the first end 1A of the flexible base substrate 1, the second flexible substrate 12 has a second opening K2 (framed by a rectangular dashed line in FIG. 9). The second opening K2 exposes the first ends 131 of the metal signal lines 13. The conductive adhesive 15 is filled in the second opening K2 for electrically connecting the metal signal line 13 and the corresponding first touch signal line 63. Specifically, the conductive adhesive 15 filled in the second opening K2 bonds the touch signal pad 64 on each of the first touch signal lines 63 to the first end 131 of the corresponding metal signal line 13, thereby realizing electrical connection there between. At the second end 1B of the flexible base substrate 1, the first flexible substrate 11 has a first opening K1, and the first opening K1 exposes the second ends 132 of the plurality of metal signal lines. These second ends 132 are electrically connected to pads (not shown in the drawing) on the processing chip 18, thereby realizing transmission of signals on the first touch signal lines 63 to the processing chip 18.

In these embodiments, the electrical connection between the first touch signal lines 63 and the processing chip 18 is realized by the metal signal lines 13, such that the transmission path of the touch signals is relatively simple, thereby reducing the contact resistance caused by the via hole or the line change, decreasing the loss of the touch signal during the transmission, and improving the touch sensitivity of the touch unit 6.

Figure 10:
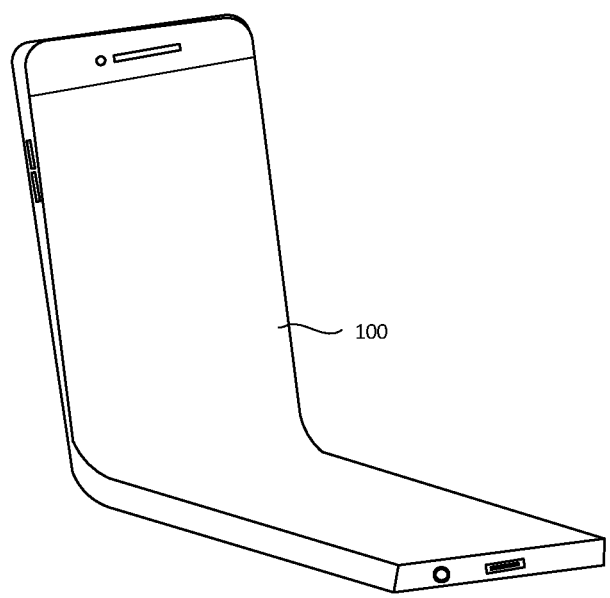
FIG. 10 illustrates a structural schematic diagram of a display device according to an embodiment of the present disclosure.

As shown in FIG. 10, some embodiments of the present disclosure further provide a display device. The display device includes any of the above display panels 100, and the specific structure of the display panels 100 has been described in detail in the above embodiments and will not be described herein again. Of course, the display device shown in FIG. 10 is merely illustrative, and the display device may be any electronic device having a display function such as a mobile phone, a tablet computer, a notebook computer, an e-book, or a television.

The display device provided by the embodiments of the present disclosure includes the above-mentioned display panel. Therefore, in the display panel and the display device provided by the embodiments of the present disclosure, the touch signal lines located in the touch unit are electrically connected to the processing chip located at one end of the flexible base substrate by the conductive adhesive. Control on the control unit and the display unit is implemented by the processing chip, thereby saving the flexible print circuit and the touch control chip corresponding to the touch unit. The conductive adhesive is provided on the border area of the display panel, and reversely coats the flexible base substrate. That is, an opening is formed at the side of the flexible base substrate facing away from the display unit, such that the conductive adhesive is bonded to the metal signal lines in the flexible base substrate, thereby reducing the influence on the respective metal film layers in the display unit. At the same time, the size of the opening is not affected by the display unit, and it is possible to expose as many metal signal lines as possible within a reasonable range, such that the conductive adhesive fully contacts the metal signal lines, thereby reducing the contact resistance and increasing the bonding firmness. The above-described embodiments are merely illustrative but not intended to provide any limitation. Any modification, equivalent substitution, improvement, etc., made within the scope of the present disclosure is included within the protection scope of the present disclosure.

What is claimed is:

1. A display panel, comprising:
   a flexible base substrate comprising a first flexible substrate, a second flexible substrate, and a plurality of metal signal lines located between the first flexible substrate and the second flexible substrate;
   a display unit disposed on the flexible base substrate;
   a touch unit disposed on a light-exiting side of the display unit and covering the display unit; and
   a processing chip connected to the flexible base substrate and configured to receive and feedback signals from the display unit and/or the touch unit;
   wherein the plurality of metal signal lines is electrically connected to the processing chip;
   wherein the touch unit transmits a touch signal to the plurality of metal signal lines through a conductive adhesive;
   wherein the touch unit comprises a plurality of touch electrodes and a plurality of first touch signal lines connected to the plurality of touch electrodes;
   wherein the plurality of first touch signal lines is electrically connected to the plurality of metal signal lines through the conductive adhesive;
   wherein the second flexible substrate is located at a side of the first flexile substrate facing away from the display unit and has a second opening; the second opening exposes first ends of the plurality of metal signals lines; and wherein the conductive adhesive is filled in the second opening for electrically connecting the plurality of metal signal lines and the plurality of first touch signal lines;
   wherein the second opening is arranged at an end of the second flexible substrate, and a part of a projection of the first flexible substrate on the second flexible substrate is out of the second flexible substrate; and the conductive adhesive has an "L" shape and comprises a first end connected to the plurality of touch electrodes and a second end connected to the end of the second flexible substrate and the plurality of metal signal lines.

2. The display panel according to claim 1, wherein the first flexible substrate has a first opening; wherein the first opening exposes second ends of the plurality of metal signal lines; and wherein the second ends are electrically connected to pads on the processing chip so as to transmit signals of the plurality of first touch signal lines to the processing chip.

3. The display panel according to claim 1, wherein the display unit comprises a first metal layer;
   wherein the display panel has a non-display area, in which the first metal layer comprises a plurality of first metal lead lines;
   wherein in the non-display area, second ends of the plurality of metal signal lines are electrically connected to the plurality of first metal lead lines; and
   wherein the plurality of first metal lead lines is electrically connected to pads on the processing chip so as to transmit the signals on the plurality of first touch signal lines to the processing chip.

4. The display panel according to claim 3, wherein the display panel further has a display area, in which the first metal layer further comprises one or more of a data line, a scan line, a light-emitting signal control line, and a capacitor electrode plate.

5. The display panel according to claim 1, wherein the flexible base substrate further comprises an inorganic insulating layer, and the plurality of metal signal lines is disposed on one side of the inorganic insulating layer; and
   wherein the inorganic insulating layer is configured to enhance mechanical strength of the flexible base substrate.

6. The display panel according to claim 5, wherein the inorganic insulating layer has a thickness smaller than or equal to one eighth of a thickness of the first flexible substrate or the second flexible substrate.

7. The display panel according to claim 1, wherein the conductive adhesive is disposed at a first end of the flexible base substrate, wherein the processing chip is connected to a second end of the flexible base substrate; and
   wherein the processing chip is bent to a side of the display panel facing away from the light-exiting side.

8. The display panel according to claim 7, wherein the conductive adhesive forms a plurality of conductive adhesive elements, each disposed at the first end of the flexible base substrate, and wherein a number of the plurality of conductive adhesive elements is equal to a number of the plurality of first touch signal lines;
   wherein the plurality of conductive adhesive elements is independent and electrically insulated from one another; and
   wherein each of the plurality of conductive adhesive elements coats an end surface of the flexible base substrate in an area where the conductive adhesive is located.

9. The display panel according to claim 1, wherein the conductive adhesive comprises a UV curable adhesive and Ag particles.

10. The display panel according to claim 1, wherein the display panel is an organic light-emitting display panel, and wherein the display panel further comprises a color filter unit provided on the light-exiting side of the display unit and covering the display unit, wherein the touch unit is disposed in a same layer as the color filter unit.

11. The display panel according to claim 10, wherein the color filter unit comprises a plurality of blocking structures arranged in a matrix, and wherein the plurality of blocking structures is made of a conductive material; and
   wherein the plurality of blocking structures is reused as the plurality of touch electrodes.

12. A display device, comprising a display panel, wherein the display panel comprises:
   a flexible base substrate comprising a first flexible substrate, a second flexible substrate, and a plurality of metal signal lines located between the first flexible substrate and the second flexible substrate;
   a display unit disposed on the flexible base substrate;
   a touch unit disposed on a light-exiting side of the display unit and covering the display unit;
   a processing chip connected to the flexible base substrate and configured to receive and feedback signals from the display unit and/or the touch unit;
   wherein the plurality of metal signal lines is electrically connected to the processing chip;
   wherein the touch unit transmits a touch signal to the plurality of metal signal lines through a conductive adhesive;
   wherein the touch unit comprises a plurality of touch electrodes and a plurality of first touch signal lines connected to the plurality of touch electrodes;
   wherein the plurality of first touch signal lines is electrically connected to the plurality of metal signal lines through the conductive adhesive;
   wherein the second flexible substrate is located at a side of the first flexile substrate facing away from the display unit and has a second opening; the second opening exposes first ends of the plurality of metal signals lines; and wherein the conductive adhesive is filled in the second opening for electrically connecting the plurality of metal signal lines and the plurality of first touch signal lines;
   wherein the second opening is arranged at an end of the second flexible substrate, and a part of a projection of the first flexible substrate on the second flexible substrate is out of the second flexible substrate; and the conductive adhesive has an "L" shape and comprises a first end connected to the plurality of touch electrodes and a second end connected to the end of the second flexible substrate and the plurality of metal signal lines.

* * * * *